(12) United States Patent
Yamagata et al.

(10) Patent No.: US 12,315,707 B2
(45) Date of Patent: May 27, 2025

(54) MOUNTING TABLE STRUCTURE, SUBSTRATE PROCESSING APPARATUS, AND METHOD OF CONTROLLING SUBSTRATE PROCESSING APPARATUS

(71) Applicant: TOKYO ELECTRON LIMITED, Tokyo (JP)

(72) Inventors: Motoi Yamagata, Tokyo (JP); Hiroshi Sone, Tokyo (JP); Masato Shinada, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 378 days.

(21) Appl. No.: 17/574,997

(22) Filed: Jan. 13, 2022

(65) Prior Publication Data

US 2022/0238314 A1   Jul. 28, 2022

(30) Foreign Application Priority Data

Jan. 22, 2021   (JP) .................. 2021-008954

(51) Int. Cl.
*H01J 37/32* (2006.01)
*C23C 14/34* (2006.01)
(Continued)

(52) U.S. Cl.
CPC ........ *H01J 37/32724* (2013.01); *C23C 14/34* (2013.01); *C23C 14/50* (2013.01);
(Continued)

(58) Field of Classification Search
CPC .............. H01J 37/32724; H01J 37/34; H01J 2237/002; H01J 2237/20235; H01J 2237/332; C23C 14/34; C23C 14/50; C23C 14/541; C23C 14/505; C23C 14/54; H01L 21/68764; H01L 21/67103; H01L 21/67109; H01L 21/6831; H01L 21/68742; H01L 21/68792; H01L 21/6833
See application file for complete search history.

(56) References Cited

U.S. PATENT DOCUMENTS 6,705,394 B1 * 3/2004 Moslehi ............ H01L 21/67248
118/724
10,679,845 B2   6/2020 Inadomi et al.
(Continued)

FOREIGN PATENT DOCUMENTS

JP    S63-01 4858 A    1/1988
JP    2003-231970 A    8/2003
(Continued)

*Primary Examiner* — James Lin
*Assistant Examiner* — Patrick S Ott
(74) *Attorney, Agent, or Firm* — Fenwick & West LLP

(57) ABSTRACT

A mounting table structure includes a mounting table on which a substrate is mounted, a refrigerating mechanism configured to cool the substrate, an elevating drive part configured to move the mounting table or the refrigerating mechanism up and down, and at least one contact provided at a position between the refrigerating mechanism and the mounting table which face each other. The refrigerating mechanism and the mounting table are allowed to be brought into contact with each other via the contact by moving the mounting table or the refrigerating mechanism up and down by the elevating drive part.

15 Claims, 7 Drawing Sheets

(51) Int. Cl.
*C23C 14/50* (2006.01)
*C23C 14/54* (2006.01)
*H01J 37/34* (2006.01)
*H01L 21/687* (2006.01)

(52) U.S. Cl.
CPC ............. *C23C 14/541* (2013.01); *H01J 37/34* (2013.01); *H01J 2237/002* (2013.01); *H01J 2237/20235* (2013.01); *H01J 2237/332* (2013.01); *H01L 21/68764* (2013.01)

(56) References Cited

U.S. PATENT DOCUMENTS

| | | | |
|---|---|---|---|
| 2016/0071707 A1* | 3/2016 | Furukawa | H01J 37/32733 |
| | | | 204/298.09 |
| 2017/0256398 A1 | 9/2017 | Inadomi et al. | |
| 2019/0103301 A1* | 4/2019 | Tashiro | H01L 21/68792 |
| 2020/0093027 A1 | 3/2020 | Abarra | |

FOREIGN PATENT DOCUMENTS

| | | |
|---|---|---|
| JP | 2016-053202 A | 4/2016 |
| JP | 2017-157746 A | 9/2017 |
| JP | 6559347 B2 | 8/2019 |
| JP | 2020-047624 A | 3/2020 |
| JP | 2020-072249 A | 5/2020 |
| KR | 10-2016-0028971 A | 3/2016 |

* cited by examiner

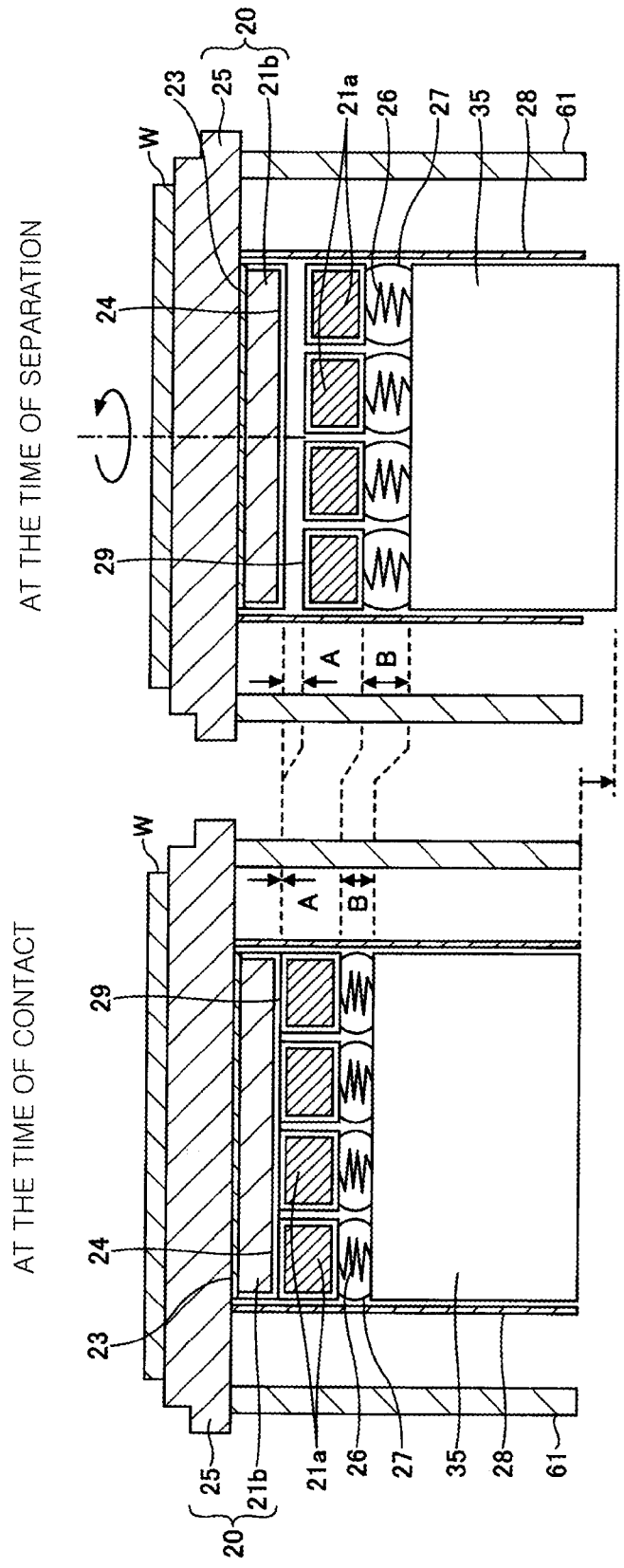

IIIB-IIIB CROSS SECTION

IIIC-IIIC CROSS SECTION

FIG.5

|   | OPERATION | CONTACT | ROTATION OF MOUNTING TABLE |
|---|---|---|---|
| 1 | SUBSTRATE LOADING | CONTACT | STOP |
| 2 | COOLING CHUCK AND SUBSTRATE | CONTACT | STOP |
| 3 | PROCESS | SEPARATION | ROTATION |
| 4 | SUBSTRATE UNLOADING | CONTACT | STOP |
| 5 | IDLING (SUBSTRATE STANDBY) | CONTACT | STOP |

MOUNTING TABLE STRUCTURE, SUBSTRATE PROCESSING APPARATUS, AND METHOD OF CONTROLLING SUBSTRATE PROCESSING APPARATUS

CROSS-REFERENCE TO RELATED APPLICATIONS

This application claims priority to Japanese Patent Application No. 2021-008954 filed on Jan. 22, 2021, the entire contents of which are incorporated herein by reference.

TECHNICAL FIELD

The present disclosure relates to a mounting table structure, a substrate processing apparatus, and a method of controlling the substrate processing apparatus.

BACKGROUND

Extremely low temperature processing may be required in a substrate processing apparatus, for example, a film forming apparatus. For example, Japanese Laid-open Patent Publication No. 2020-72249 provides a stage device and a processing apparatus that can rotate a mounted substrate in a state in which the substrate is cooled to an extremely low temperature and high cooling performance is provided. In such a processing apparatus, a cooling gas supplied from the outside of the processing apparatus is sufficiently cooled and supplied to a gap between a stage and a refrigerating heat transfer body to cool the stage to an extremely low temperature.

Japanese Patent No. 6559347 proposes a holding device that rotatably holds a target subject to be processed (hereinafter, referred to as "target subject") while the target subject is cooled in a vacuum chamber, and includes a stage on which the target subject is installed, a rotary driving means that rotatably supports the stage, and a cooling means which cools the stage. In the holding device, the cooling means includes a cooling panel that is disposed in a space below the stage to face a lower surface of the stage with a gap therebetween, a heat transfer shaft that is inserted into a rotating shaft and comes into contact with the lower surface of the cooling panel, and a refrigerator that cools the heat transfer shaft.

SUMMARY

In an indirect method using a refrigerant such as a cooling gas, a partial contact cooling method using a powdery or paste-like heat conductive material, or a cooling method using both of the above methods, it may take some time to control to a target cooling temperature.

The present disclosure provides a mounting table structure, a substrate processing apparatus, and a method of controlling the substrate processing apparatus capable of enhancing the cooling efficiency of a substrate.

One aspect of the present disclosure provides a mounting table structure comprising a mounting table on which a substrate is mounted, a refrigerating mechanism configured to cool the substrate, an elevating drive part configured to move the mounting table or the refrigerating mechanism up and down, and at least one contact provided at a position between the refrigerating mechanism and the mounting table which face each other. The refrigerating mechanism and the mounting table are allowed to be brought into contact with each other via the contact by moving the mounting table or the refrigerating mechanism up and down by the elevating drive part.

BRIEF DESCRIPTION OF THE DRAWINGS

FIGS. 2A and 2B are diagrams illustrating an example of a periphery of a contact of a mounting table structure according to the embodiment.

FIG. 5 is a diagram illustrating an example of an operation of a substrate processing apparatus and a state of the contact according to the embodiment.

DETAILED DESCRIPTION

Figure 1:
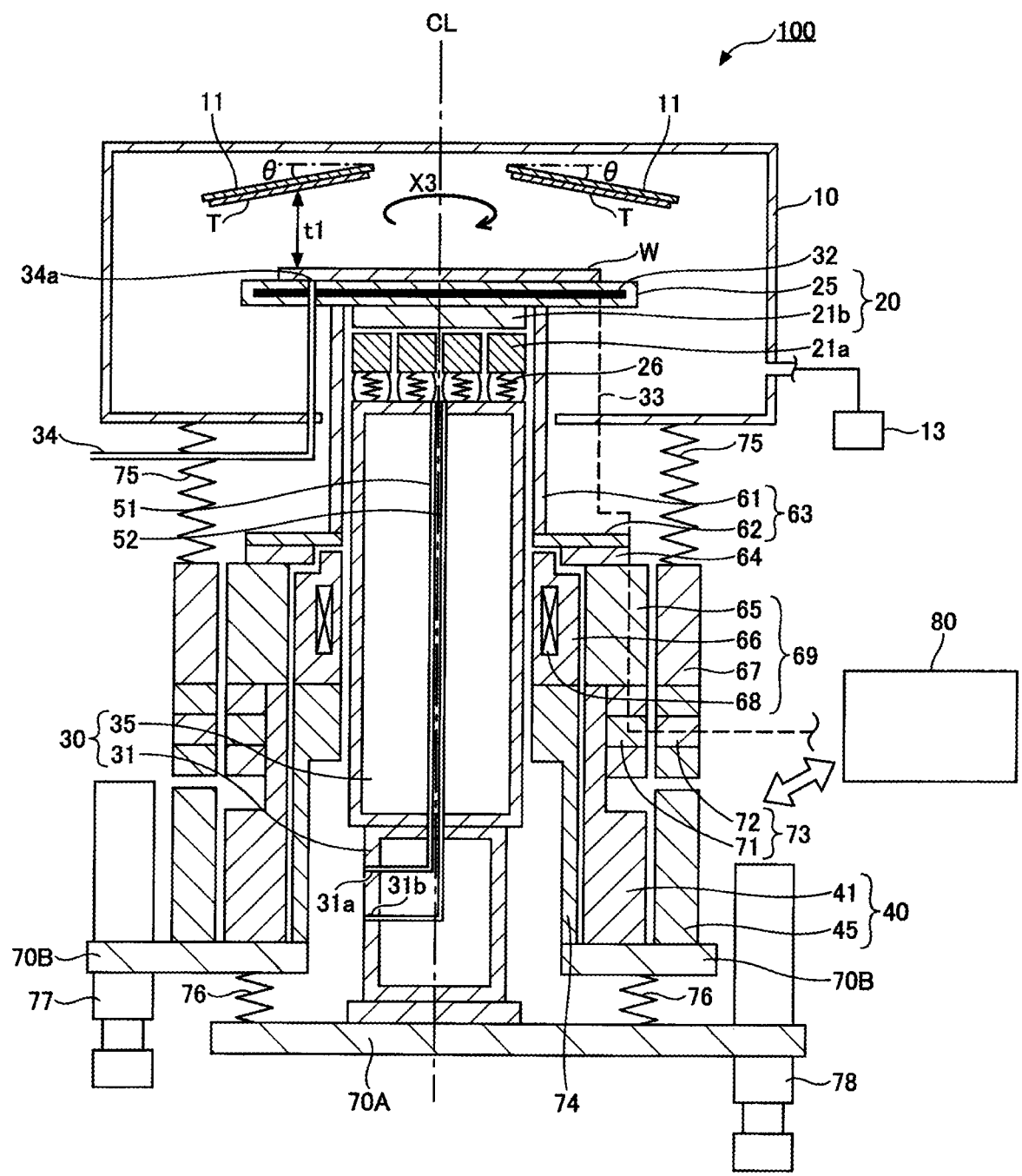
FIG. 1 is a schematic cross-sectional view illustrating an example of a substrate processing apparatus according to an embodiment.

Hereinafter, embodiments for implementing the present disclosure will be described with reference to the drawings. In each of the accompanying drawings, the same components may be designated by the same reference numerals, and duplicate descriptions thereof may be omitted.

[Substrate Processing Apparatus]

First, an example of a substrate processing apparatus 100 according to an embodiment of the present disclosure will be described with reference to FIG. 1. FIG. 1 is a longitudinal cross-sectional view illustrating an example of the substrate processing apparatus 100 according to the embodiment. The substrate processing apparatus 100 illustrated in FIG. 1 is, for example, an apparatus that performs desired film formation on a substrate W such as a semiconductor wafer as a substrate to be processed inside a vacuum processing container 10 that forms a vacuum atmosphere and performs substrate processing with a processing gas. The substrate processing apparatus is a physical vapor deposition (PVD) apparatus.

The substrate processing apparatus 100 includes a vacuum processing container 10, a mounting table 20, a refrigerating device 30, a rotating device 40, a first elevating device 77, and a second elevating device 78. The mounting table 20 mounts the substrate W thereon inside the vacuum processing container 10. The rotating device 40 rotates the mounting table 20. The first elevating device 77 moves the mounting table 20 up and down. The second elevating device 78 moves the refrigerating device 30 up and down. The substrate processing apparatus 100 further includes a controller 80 that controls various devices such as the refrigerating device 30, the rotating device 40, the first elevating device 77, and the second elevating device 78. The substrate processing apparatus 100 of the illustrated example includes two elevating devices including the first elevating device 77 that moves the mounting table 20 up and down and the second elevating device 78 that moves the refrigerating device 30 up and down, but the mounting table 20 and the refrigerating device 30 may be moved up and down by a common elevating device.

A refrigerator 31 and a cold link 35 of the refrigerating device 30 which will be described below are examples of a refrigerating mechanism for cooling the substrate W. The rotating device 40 is an example of a rotation drive part that rotates the substrate W. The first elevating device 77 and the second elevating device 78 are examples of an elevating drive part for moving a substrate or a refrigerating mechanism up and down.

In the inside of the vacuum processing container 10, the mounting table 20 is located on the lower side, and a plurality of target holders 11 are fixed above the mounting table 2 in a state in which they have a predetermined inclination angle θ with respect to a horizontal plane. Then, different types of targets T are mounted on lower surfaces of the target holders 11. The inclination angle θ may be 0°, that is, the target holder 11 may be fixed horizontally.

The vacuum processing container 10 is configured so that a pressure therein is reduced to a vacuum by operating an exhaust device 13 such as a vacuum pump. A processing gas (for example, a rare gas such as argon (Ar), krypton (Kr), neon (Ne), or a nitrogen ($N_2$) gas) required for a film formation by sputtering is supplied from a processing gas supply device (not illustrated) to the vacuum processing container 10.

An alternating current (AC) voltage or a direct current (DC) voltage from a plasma generation power supply (not illustrated) is applied to the target holder 11. When an AC voltage is applied from the plasma generation power supply to the target holder 11 and the target T, plasma is generated inside the vacuum processing container 10, and a rare gas or the like inside the vacuum processing container 10 is ionized. Then, the target T is sputtered by an ionized rare gas element or the like. Atoms or molecules of the sputtered target T are deposited on a surface of the substrate W held on the mounting table 20 to face the target T.

It is possible to adjust an incident angle at which the sputtered particles sputtered from the target T are incident on the substrate W by inclining the target T with respect to the substrate W, and thus it is possible to improve the in-plane uniformity of a film thickness of a magnetic film or the like formed on the substrate W. Even when each of the target holders 11 is installed at the same inclination angle θ inside the vacuum processing container 10, the mounting table 20 is moved up and down to change a distance t1 between the target T and the substrate W, and thus the incident angle of the sputtered particles on the substrate W can be changed. Therefore, the mounting table 20 is controlled to move up and down so that the distance t1 suitable for each of the targets T is set for each of the targets T to be applied.

The number of targets T is not particularly limited, but from the viewpoint that different films formed of different materials can be sequentially formed by one substrate processing apparatus 100, preferably, a plurality of different targets T are present inside the vacuum processing container 10.

The refrigerating device 30 includes the refrigerator 31 and the cold link 35, and the cold link 35 is stacked on the refrigerator 31. A plurality of contacts 21a are provided on the cold link 35 of the refrigerating device 30, and the mounting table 20 is disposed via the plurality of contacts 21a. The refrigerator 31 holds the cold link 35 and can cool an upper surface of the cold link 35 to an extremely low temperature of, for example, −30° C. or lower to about −200° C. From the viewpoint of cooling capacity, the refrigerator 31 preferably uses a Gifford-McMahon (GM) cycle.

The cold link 35 is fixed on the refrigerator 31, and an upper portion thereof is accommodated inside the vacuum processing container 10. The cold link 35 is made of copper (Cu) or the like having high thermal conductivity, and an exterior thereof is substantially cylindrical. The refrigerator 31 and the cold link 35 are disposed so that centers thereof coincide with a central axis CL of the mounting table 20.

A refrigerant supply flow path 51 and a refrigerant discharge flow path 52 are disposed inside the cold link 35 and the refrigerator 31. The refrigerant supply flow path 51 supplies a refrigerant, which is a heat transfer gas, between the cold link 35 and the mounting table 20. The refrigerant discharge flow path 52 discharges the refrigerant of which temperature is raised by heat transfer from the mounting table 20. The refrigerant supply flow path 51 and the refrigerant discharge flow path 52 are examples of flow paths provided in a refrigerating mechanism to supply a temperature control medium such as a refrigerant.

The refrigerant supply flow path 51 and the refrigerant discharge flow path 52 are respectively fixed to connection fixing parts 31a and 31b on a wall surface of the refrigerator 31. The refrigerant supply flow path 51 and the refrigerant discharge flow path 52 are examples of flow paths for supplying the temperature control medium provided in the refrigerating device 30.

A temperature control refrigerant (for example, a first cooling gas) is supplied from a refrigerant supply device (not illustrated) and flows through the refrigerant supply flow path 51. Distal ends of the refrigerant supply flow path 51 and the refrigerant discharge flow path 52 open in an upper surface of the cold link 35, and the first cooling gas is supplied to a space in which a spring 26 is disposed between the cold link 35 and the mounting table 20. As the first cooling gas supplied to the space in which the spring 26 is disposed, helium (He) gas having high thermal conductivity is preferably used. As the first cooling gas, an inert gas may be used so that the spring 26 and the like in the space do not corrode. Thus, the thermal conductivity of the space between the cold link 35 and the mounting table 20 can be increased, and cooling efficiency of the substrate W can be enhanced.

The refrigerant discharged from the space in which the spring 26 is disposed flows through the refrigerant discharge flow path 52 and is discharged to a refrigerant discharge device (not illustrated). The refrigerant supply flow path 51 and the refrigerant discharge flow path 52 may be formed by the same flow path.

The plurality of contacts 21a are provided on the side of the cold link 35 of the refrigerating device 30. The plurality of contacts 21a are respectively connected to a plurality of springs 26 and are mounted to face the mounting table 20. The plurality of springs 26 may be spiral-shaped springs such as compression coil springs. The spring 26 is an example of an elastic body. The contact 21a is made of copper (Cu) having high thermal conductivity. However, it may be configured of any material having high thermal conductivity.

The mounting table 20 has a structure in which an upper mounting part 25 on which the substrate W is mounted and a lower contact 21b are stacked, and the mounting part 25 and the contact 21b are formed of copper (Cu) having high thermal conductivity. However, the mounting part 25 and the contact 21b may be formed of any material having high thermal conductivity. The mounting part 25 includes an electrostatic chuck, and the electrostatic chuck has a chuck electrode 32 embedded in a dielectric film. A predetermined potential is applied to the chuck electrode 32 via a wiring 33.

With such a configuration, the substrate W can be suctioned by the electrostatic chuck, and the substrate W can be held on an upper surface of the mounting table 20.

In the present embodiment, the plurality of contacts 21a disposed on the side of the cold link 35 of the refrigerating device 30, and the contact 21b disposed on the side of the mounting table 20 are provided. The contact 21a and the contact 21b can be brought into contact with each other or separated from each other by up and down movement due to at least one of the first elevating device 77 that moves the mounting table 20 up and down and the second elevating device 78 that moves the refrigerating device 30 up and down. That is, the cold link 35 of the refrigerating device 30 and the mounting table 20 can be brought into contact with each other via the plurality of contacts 21a and the contact 21b.

The mounting table 20 is supported by an outer cylinder 63. The outer cylinder 63 is disposed to cover an outer peripheral surface of an upper portion of the cold link 35, and an upper portion thereof enters the inside of the vacuum processing container 10 and supports the mounting table 20 inside the vacuum processing container 10. The outer cylinder 63 has a cylindrical part 61 having an inner diameter slightly larger than an outer diameter of the cold link 35, and a flange part 62 extending from the lower surface of the cylindrical part 61 in an outer diameter direction, and the cylindrical part 61 directly supports the mounting table 20. The cylindrical part 61 and the flange part 62 are formed of a metal such as stainless steel.

A heat insulating member 64 is connected to a lower surface of the flange part 62. The heat insulating member 64 has a substantially cylindrical shape that extends coaxially with the flange part 62 and is fixed to the lower surface of the flange part 62. The heat insulating member 64 is made of a ceramic such as alumina. A magnetic fluid sealing part 69 is provided on a lower surface of the heat insulating member 64.

The magnetic fluid sealing part 69 includes a rotating part 65, an inner fixing part 66, an outer fixing part 67, and a heating source 68. The rotating part 65 has a substantially cylindrical shape that extends coaxially with the heat insulating member 64 and is fixed to the lower surface of the heat insulating member 64. In other words, the rotating part 65 is connected to the outer cylinder 63 via the heat insulating member 64. With such a configuration, the heat transfer of cold and heat of the outer cylinder 63 to the rotating part 65 is blocked by the heat insulating member 64, and it is possible to prevent the temperature of a magnetic fluid of the magnetic fluid sealing part 69 from being lowered, to prevent deterioration of sealing performance, and to suppress the occurrence of dew condensation.

The inner fixing part 66 is provided between the cold link 35 and the rotating part 65 via a magnetic fluid. The inner fixing part 66 has a substantially cylindrical shape in which an inner diameter thereof is larger than an outer diameter of the cold link 35 and an outer diameter thereof is smaller than an inner diameter of the rotating part 65. The outer fixing part 67 is provided outside the rotating part 65 via a magnetic fluid. The outer fixing part 67 has a substantially cylindrical shape in which an inner diameter thereof is larger than an outer diameter of the rotating part 65. The heating source 68 is embedded inside the inner fixing part 66 and heats the entire magnetic fluid sealing part 69. With such a configuration, it is possible to prevent the temperature of the magnetic fluid of the magnetic fluid sealing part 69 from being lowered, to prevent deterioration of the sealing performance, and to suppress the occurrence of dew condensation. With such a configuration, in the magnetic fluid sealing part 69, the rotating part 65 is rotatable in a state in which it is airtight with respect to the inner fixing part 66 and the outer fixing part 67. That is, the outer cylinder 63 is rotatably supported via the magnetic fluid sealing part 69.

A substantially cylindrical bellows 75 is provided between an upper surface of the outer fixing part 67 and a lower surface of the vacuum processing container 10. The bellows 75 is a metal bellows structure that can be expanded and contracted in a vertical direction. The bellows 75 surrounds an upper portion of the cold link 35, a lower portion of the outer cylinder 63, and the heat insulating member 64, and separates an internal space of the vacuum processing container 10 capable of being decompressed and an external space of the vacuum processing container 10 from each other.

A slip ring 73 is provided below the magnetic fluid sealing part 69. The slip ring 73 has a rotating body 71 including a metal ring, and a fixed body 72 including a brush. The rotating body 71 has a substantially cylindrical shape that extends coaxially with the rotating part 65 of the magnetic fluid sealing part 69 and is fixed to a lower surface of the rotating part 65. The fixed body 72 has a substantially cylindrical shape in which an inner diameter thereof is slightly larger than an outer diameter of the rotating body 71. The slip ring 73 is electrically connected to a DC power supply (not illustrated), and electric power supplied from the DC power supply is supplied to the wiring 33 via the brush of the fixed body 72 and the metal ring of the rotating body 71. With such a configuration, it is possible to apply a potential to the chuck electrode from the DC power supply without causing twisting or the like in the wiring 33. The rotating body 71 constituting the slip ring 73 is mounted in the rotating device 40. The slip ring 73 may have a structure other than the brush structure and may have, for example, a non-contact power supply structure, a structure that is mercury-free or has a conductive liquid, or the like.

The rotating device 40 is a direct drive motor having a rotor 41 and a stator 45. The rotor 41 has a substantially cylindrical shape that extends coaxially with the rotating body 71 of the slip ring 73 and is fixed to the rotating body 71. The stator 45 has a substantially cylindrical shape in which an inner diameter thereof is larger than an outer diameter of the rotor 41. With such a configuration, when the rotor 41 rotates, the rotating body 71, the rotating part 65, the outer cylinder 63, and the mounting table 20 rotate in an X3 direction relative to the cold link 35. The rotating device may have a form other than the direct drive motor, or may have a form including a servomotor and a transmission belt.

Further, a heat insulating body 74 having a vacuum heat insulating double structure is provided around the refrigerator 31 and the cold link 35. In the illustrated example, the heat insulating body 74 is provided between the refrigerator 31 and the rotor 41 and between a lower portion of the cold link 35 and the rotor 41. With such a configuration, it is possible to suppress the heat transfer of cold and heat of the refrigerator 31 and the cold link 35 to the rotor 41.

Further, the refrigerator 31 is fixed to an upper surface of a first support 70A which is mounted in the second elevating device 78 to be movable up and down. Meanwhile, the rotating device 40 and the heat insulating body 74 are fixed to an upper surface of a second support 70B which is mounted in the first elevating device 77 to be movable up and down. Additionally, a substantially cylindrical bellows 76 surrounding the refrigerator 31 is provided between the upper surface of the first support 70A and a lower surface of the second support 70B. Like the bellows 75, the bellows 76 is also a metal bellows structure that can be expanded and contracted in the vertical direction.

A second cooling gas supply pipe 34 for supplying a second cooling gas is provided in the mounting table 20. The second cooling gas supply pipe 34 passes through the mounting part 25 and supplies the second cooling gas such as He gas between a lower surface of the substrate W and an upper surface of the mounting part 25 from a gas hole 34a. The second cooling gas may be a gas different from the first cooling gas flowing through the refrigerant supply flow path 51 or may be the same gas. As the second cooling gas, an inert gas may be used. As a result, the thermal conductivity of the space between the lower surface of the substrate W and the upper surface of the mounting part 25 can be increased, and the cooling efficiency of the substrate W can be enhanced.

The controller 80 is configured as a computer. The controller 80 includes a central processing unit (CPU), a main storage device, an auxiliary storage device, an input and output interface, and a communication interface which are connected to each other by a connection bus. The main storage device and the auxiliary storage device are computer-readable recording media.

The CPU performs control of the entire controller 80. For example, the CPU executably expands a program stored in the auxiliary storage device in a work area of the main storage device and performs control of peripheral devices through execution of the program, thereby providing a function suitable for a predetermined purpose. The main storage device stores a computer program executed by the CPU, data processed by the CPU, and the like. The main storage device includes, for example, a flash memory, a random access memory (RAM), and a read only memory (ROM). The auxiliary storage device stores various programs and various types of data in a readable and writable recording medium. The auxiliary storage device is a silicon disk including a non-volatile semiconductor memory, a hard disk drive (HDD) device, a solid state drive device, or the like. Further, the auxiliary storage device may be a compact disc (CD), a digital versatile disc (DVD), a Blu-ray disc (BD), a universal serial bus (USB) memory, an secure digital (SD) memory card or the like as a detachable and attachable recording medium. The communication interface is an interface with a network connected to the controller 80. The input and output interface is an interface for inputting and outputting data between the controller 80 and a device connected to the controller 80, and examples thereof include a keyboard and a touch panel. The controller 80 receives an operation instruction or the like from an operator, who operates an input device, via the input and output interface. The controller 80 controls operations of various peripheral devices. These peripheral devices include the refrigerating device 30, the rotating device 40, the first elevating device 77, the second elevating device 78, and the like.

As described above, a mounting table structure of the substrate processing apparatus 100 includes the mounting table 20 on which the substrate W is placed, a refrigerating mechanism that cools the substrate W, an elevating drive part that moves the mounting table 20 or the refrigerating mechanism up and down, and contacts provided at positions on the refrigerating mechanism and the mounting table 20 which face each other, and is configured so that the refrigerating mechanism and the mounting table 20 can be brought into contact with each other via the contacts by the up and down movement of the mounting table 20 or the refrigerating mechanism due to the elevating drive part.

[Direct Contact by Contact]

Next, the periphery of the contact of the mounting table structure according to the embodiment will be described with reference to FIGS. 2A and 2B. FIGS. 2A and 2B are diagrams illustrating an example of the periphery of the contact of the mounting table structure according to the embodiment.

Among the constituents of the substrate processing apparatus 100 of FIG. 1, the refrigerating device 30 is configured to be movable up and down by the second elevating device 78, and the mounting table 20 is configured to be movable up and down by the first elevating device 77.

Before a film forming process, for example, the contact 21a and the contact 21b can be brought into direct contact with each other by the upward movement of the refrigerating device 30 due to the second elevating device 78 as illustrated at the time of contact in FIG. 2A. Before the film forming process, the contact 21a and the contact 21b may be brought into direct contact with each other by the downward movement of the mounting table 20 due to the first elevating device 77 as illustrated at the time of contact in FIG. 2A.

Meanwhile, at the time of the film forming process, a distance t1 between the target T and the substrate W is adjusted by, for example, the upward movement of the mounting table 20 inside the vacuum processing container 10 due to the first elevating device 77. The adjustment of the distance t1 is appropriately changed according to the type of target T to be applied. Further, in order to form a film while the mounting table 20 is rotated during the film forming process, the contact 21a and the contact 21b are separated from each other as illustrated in FIG. 2B. As a result, a film can be formed on the substrate W, while the mounting table 20 is rotated by the rotating device 40. When it is not necessary to adjust the distance t1, instead of moving the first elevating device 77 up, the second elevating device 78 may be moved down to separate the contact 21a and the contact 21b from each other. The contact 21a and the contact 21b may be separated by synchronous control between the first elevating device 77 and the second elevating device 78. Hereinafter, an example in which the refrigerating device 30 is moved up and down by the second elevating device 78 will be described.

In the case of an indirect method using a refrigerant such as a cooling gas, a partial contact cooling method using a powdery or paste-like heat conductive material, or an existing cooling method using both of them, a cooling operation may take some time due to low thermal conductivity. In this case, it becomes difficult to suppress the temperature rise of the mounting table 20 at the time of repeated heat input during the film forming process, to quickly return to a target cooling temperature at that time, and to control the temperature of the substrate W.

On the other hand, in the substrate processing apparatus 100 according to the present embodiment, the cold link 35 of the refrigerating device 30 and the mounting table 20 are physically brought into contact with each other via the contacts 21a and 21b except during the film forming process. As a result, the thermal conductivity from the refrigerating device 30 to the mounting table 20 is increased by direct contact of the contacts 21a and 21b, the cooling time of the substrate W can be shortened, and throughput can be enhanced.

Figure 3A:
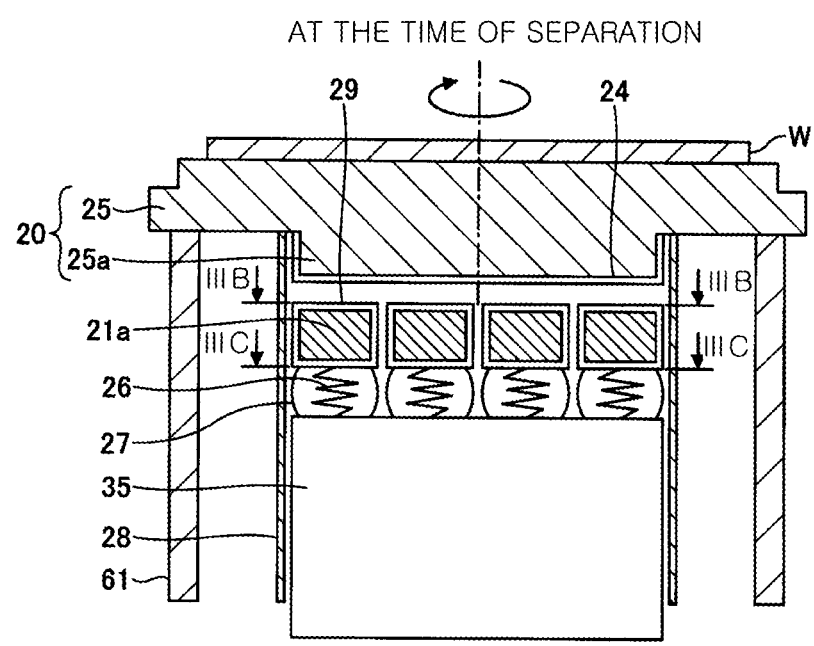
FIGS. 3A to 3C are diagrams illustrating a periphery of the contact of the mounting table structure according to the embodiment.
Figure 3B:
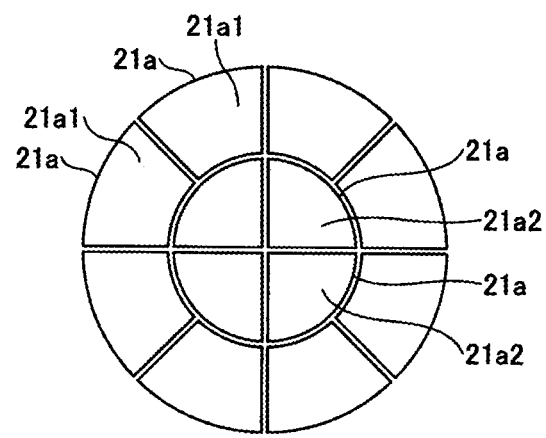
Figure 3C:
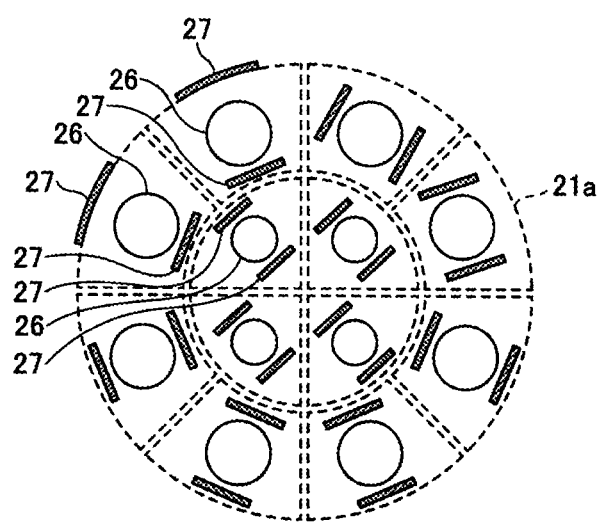

The mounting table structure according to the present embodiment will be further described with reference to FIGS. 3A to 3C. FIGS. 3A to 3C are diagrams illustrating the periphery of the contact of the mounting table structure according to the embodiment. FIG. 3B illustrates a surface of the contact 21a seen in a IIIB-IIIB direction of FIG. 3A, and FIG. 3C illustrates an arrangement of the spring 26 and the like under the contact 21a seen in a IIIC-IIIC direction.

In FIGS. 2A and 2B, a configuration in which the plurality of contacts 21a and the contacts 21b are in direct contact with each other has been described. At this time, since the mounting part 25 and the contact 21b are formed of copper (Cu) having high thermal conductivity, the contact 21b and the mounting part 25 are contact portions between metal workpieces. Therefore, as illustrated in FIG. 2B, an indium sheet 23, which is soft and has good thermal conductivity, is sandwiched between the contact 21b and the mounting part 25 to avoid contact between the metal workpieces and to prevent metal contamination. A metal sheet other than the indium sheet 23 may be used.

However, the mounting table 20 is not limited to a stacked structure of the mounting part 25 and the contact 21b, and as illustrated in FIG. 3A, the mounting part 25 and the contact 21b may be integrated into one plate. In this case, the plurality of contacts 21a and the mounting part 25 (a convex portion 25a) are in direct contact with each other.

In the present embodiment, a contact surface of the mounting part 25 that comes into contact with the plurality of contacts 21a is circular and flat. Meanwhile, as illustrated in FIG. 3B, contact surfaces of the plurality of contacts 21a that come into contact with the mounting part 25 have a shape in which a circle having the same diameter as the contact surface of the mounting part 25 is divided into four on the inner peripheral side and eight on the outer peripheral side. As described above, it is preferable that the contact 21a is divided into a plurality of blocks, and the contact surface of the contact 21a is divided into a plurality of blocks. In the example of FIG. 3B, the contact 21a is divided into 12 blocks and has 12 contact surfaces. More specifically, four contacts 21a having contact surfaces 21a2 having the same contact area are provided on the inner peripheral side, and eight contacts 21a having contact surfaces 21a1 having the same contact area are provided on the outer peripheral side. However, a shape of the contact surface of the contact 21a is not limited thereto. The shape of the contact surface of the contact 21a may be a circular shape, a quadrangular shape, or any other shape. The plurality of divided contact surfaces 21a1 and 21a2 of the contact 21a are flat surfaces.

When the contact 21a is not divided, the contact surface of the contact 21a becomes one surface, and thus the contact with the mounting part 25 may be partially performed. On the other hand, since the contact surface is divided by dividing into the plurality of contacts 21a, the contact surface of the mounting part 25 easily comes into surface contact with the contact surfaces 21a1 and 21a2 of the plurality of contacts 21a. As a result, a contact area between the plurality of contacts 21a and the mounting part 25 is increased as compared with a case in which the contact surface of the contacts 21a is not divided, and contact efficiency can be enhanced.

As an example illustrated in FIG. 3C, one spring 26 is mounted on each of the contacts 21a divided into 12 blocks. Since the spring 26 is provided for each of the 12 contacts 21a, a mechanism in which, when the plurality of contacts 21a and the mounting part 25 come into contact with each other, a force applied to each of the contacts 21a and the mounting part 25 can be absorbed by the spring 26 is formed. In other words, it is possible to avoid damage to the plurality of contacts 21a and the mounting part 25 by absorbing the force applied at the time of contact by the spring 26.

When the contacts 21a and the mounting part 25 are brought into contact with each other, the contacts 21a and the mounting part 25 may not correctly come into contact with each other. Therefore, it is possible to make the contact by dividing the contact 21a into contact with the mounting part 25 more efficiently than to bring the contact 21a into contact with the mounting part 25 with a single plate, and the contact area increases. Further, when the plurality of springs 26 are provided, the contact between the contacts 21a and the mounting part 25 can be smoothly obtained by an elastic force.

The spring 26 is preferably disposed at the center of each of the contacts 21a, but the present disclosure is not limited thereto. Further, the spring 26 is an example of an elastic body, and the elastic body may be a compression coil, a leaf spring, or the like. The plurality of contacts 21a are respectively connected to the plurality of springs 26, and are mounted on the refrigerating device 30 or the mounting table 20 via the plurality of springs 26. In the example of FIGS. 3A to 3C, 12 each of the contacts 21a is connected to one of 12 springs 26 and the contacts 21a are mounted on the upper surface of the cold link 35 of the refrigerating device 30 via the 12 springs 26. However, the contact 21a may be a single plate. When the contact 21a is a single plate, the plurality of springs 26 may be mounted between the contact 21a and the upper surface of the cold link 35.

In the present embodiment, the springs 26 such as compression coils having the same diameter are disposed on the plurality of contacts 21a, and the same number of springs 26 are disposed. However, for example, the springs 26 having different diameters may be disposed in the plurality of contacts 21a. Thus, a degree of pressing of the contact surfaces 21a1 and 21a2 of the contacts 21a on the mounting part 25 can be changed. Further, the number of springs 26 disposed in each of the plurality of contacts 21a may be changed. As a result, the degree of pressing of the contact surfaces 21a1 and 21a2 of the contacts 21a on the mounting part 25 can be changed.

Further, as illustrated in FIG. 3C, a copper plate 27 may be provided near the spring 26 mounted on each of the contacts 21a. In the example of FIG. 3C, two copper plates 27 are provided near the spring 26 of each of the contacts 21a. The copper plate 27 is formed of a material such as a metal having high thermal conductivity such as copper in order to enhance heat transfer from the refrigerating device 30 to the plurality of contacts 21a.

The number of copper plates 27 provided on each of the contacts 21a is not limited to two and may be one or three or more. The copper plate 27 is disposed outside the spring 26, but is not limited thereto, and can be provided at a position at which the copper plate 27 does not interfere with an expansion and contraction operation of the spring 26. For example, the copper plate 27 may be provided on the upper surface or the side surface of each of the contacts 21a as illustrated in FIG. 3C. The number of copper plates 27 disposed in each of the plurality of contacts 21a may be changed.

When the substrate W on the mounting part 25 that is in direct contact with the plurality of contacts 21a from the refrigerating device 30 via the spring 26 is cooled, the cooling capacity from the refrigerating device 30 to the plurality of contacts 21a may be deteriorated by the spring 26. Therefore, a plurality of copper plates 27 as heat transfer members are provided on the plurality of contacts 21a. As a result, the thermal conductivity from the refrigerating device 30 to the plurality of contacts 21a can be increased, and the cooling efficiency of the mounting table 20 and the substrate W can be enhanced.

The plurality of copper plates 27 are an example of a plurality of heat transfer members connected to the plurality of contacts 21a. The heat transfer member is not limited to the copper plate 27 and may be a conductive wire. The copper plate 27 has a structure that is thin to some extent and has high thermal conductivity to improve heat exchangeability without hindering an elastic force of the spring 26. In other words, it is preferable that an example of the heat transfer member having the plurality of copper plates 27 has high heat transfer efficiency, does not have a function of a spring, and does not interfere with a function of the spring 26. However, when the spring 26 itself is made of a material having high thermal conductivity, the copper plate 27 does not need to be provided.

As described above, the plurality of contacts 21a according to the present embodiment are mounted on the refrigerating device 30 via the plurality of springs 26 and the plurality of copper plates 27. Further, it is possible to make direct contact between the plurality of contacts 21a and the mounting table 20 by moving the refrigerating device 30 up and down by the elevating drive part. As a result, it is possible to provide a substrate processing apparatus 100 that enhances heat transfer efficiency, improves the cooling efficiency of the substrate W, suppresses damage to the contact surface of the contact 21a, and shortens the cooling time of the substrate W.

[Other Structures]

The contact provided between the cold link 35 and the mounting table 20 may be disposed only on the side of the cold link 35, may be disposed only on the side of the mounting table 20, or may be disposed on two sides of the cold link 35 and the mounting table 20.

In the substrate processing apparatus 100, at the time of the film forming process, an operation in which the contact is separated from the cold link 35 or the mounting table 20, and before and after the film forming process, the contact is brought into contact with the cold link 35 or the mounting table 20 is repeatedly performed for each of the film forming processes of the substrate W. Therefore, as illustrated in FIGS. 2 and 3A to 3C, preferably, the surfaces of the contact 21a and/or the contact 21b are surface-treated with hard silver platings 29 and 24 so that the surfaces of the contacts 21a and 21b have both durability against contact and separation, and thermal conductivity. The hard silver platings 29 and 24 suppress wear of the contact surfaces of the contacts 21a and 21b during the contact and separation, and both the durability and the thermal conductivity of the contacts 21a and 21b can be achieved at the same time. Not only the contact surfaces of the contacts 21a and 21b, but also the other surfaces of the contacts and the lower surface (the contact surface) of the mounting part 25 may be surface-treated with the hard silver platings 29 and 24.

The contact surfaces of the contacts 21a and 21b are flat. The contact surfaces of the contacts 21a and 21b are processed so that flatness thereof is within 0.01 mm and plane roughness Ra is within 0.4. As a result, the contact area between the contact 21a and the contact 21b, or between the contact 21a and the mounting part 25 can be made larger, the efficiency of heat conduction can be enhanced, and cooling efficiency can be further enhanced.

Figure 4:
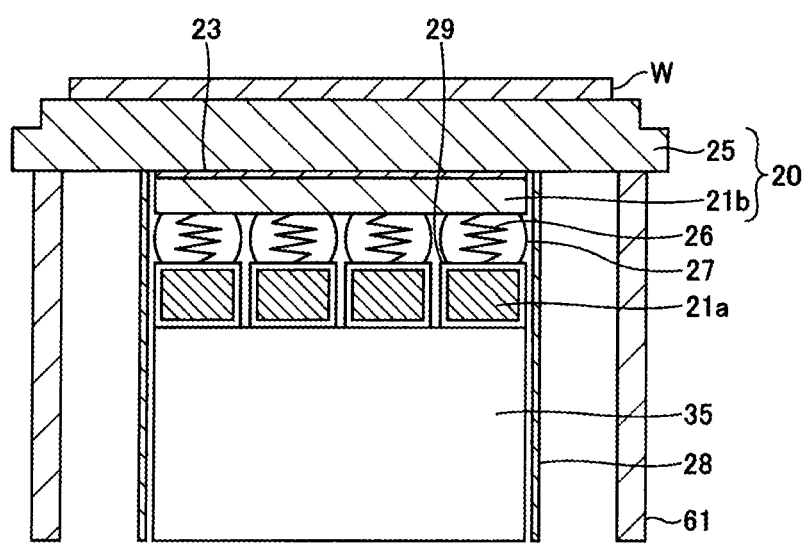
FIG. 4 is a diagram illustrating another example around the periphery of the contact of the mounting table structure according to the embodiment.

The spring 26 and the copper plate 27 connected to the contact 21a may be provided on the side of the mounting table 20, for example, as illustrated in FIG. 4. In the example of FIG. 4, the spring 26 and the copper plate 27 are connected to the contact 21b under the mounting part 25, and the plurality of contacts 21a are disposed to be suspended in a downward direction of the spring 26 and the copper plate 27. In this example, the plurality of contacts 21a are provided on the side of the mounting table 20 and come into contact with the upper surface of the cold link 35 of the refrigerating device 30.

As a contact method of the contact, a metal sealing material such as a metal O-ring or Acti-seal having thermal conductivity and springiness may be used instead of the block-shaped contacts 21a and 21b. However, since the block-shaped contacts 21a and 21b can have a large contact area and have high cooling efficiency, the block-shaped contacts are preferable in consideration of heat exchangeability. The metal sealing material such as a metal O-ring or Acti-seal may be mounted on the contact surface of each of the block-shaped contacts 21a and 21b.

A driving method of the refrigerating device 30, that is, a driving method of the second elevating device 78 may be an air cylinder or a motor. However, the air cylinder is preferable in that the refrigerating device 30 can be moved up and down only by controlling the on and off of air supply, and control is easy. Regarding the up and down movement of the refrigerating device 30, a stroke of the refrigerating device 30 may be controlled by providing a stopper, which detects the moment when the contact 21a comes into contact with the mounting part 25 or the contact 21b and stops the supply of air, to control the supply of the air cylinder.

When the refrigerating device 30 is driven by a motor, a ball screw or the like is required, and a required space is larger than that in driving by the air cylinder. Further, since the motor needs to be provided coaxially with the refrigerating device 30, a size of a device increases. In this way, it is possible to save space by adopting a method of driving the refrigerating device 30 by the air cylinder. However, the refrigerating device 30 may be driven by a motor.

As illustrated in FIGS. 2 to 4, a radiation plate 28 may be provided around the refrigerating device 30 and the contacts 21a and 21b.

As described above, according to the mounting table structure and the substrate processing apparatus 100 having the mounting table structure of the present embodiment, a contact structure with a contact connected to the refrigerating device 30 can improve the thermal conductivity from the refrigerating device 30 to the mounting table 20. As a result, the cooling efficiency of the substrate can be enhanced, and the time required for cooling the substrate W and returning to room temperature can be shortened.

[Operation of Substrate Processing Apparatus and Contact and Separation of Contact]

Next, an operation of the substrate processing apparatus 100 and contact and separation states of the contacts 21a and 21b will be described with reference to FIG. 5. FIG. 5 is a diagram illustrating an example of the operation of the substrate processing apparatus 100 and the state of the contacts according to the embodiment.

In the substrate processing apparatus 100, the refrigerating device 30 is moved up and down by moving the second elevating device 78 up and down by an air cylinder, and the refrigerating device 30 and the mounting table 20 are brought into contact with or separated from each other via the contacts 21a and 21b. As a result, in the substrate processing apparatus 100, contact (direct) cooling by the contacts 21a and 21b can be performed. Hereinafter, the contact and separation states of the contacts 21a and 21b when the substrate W is processed by the substrate processing apparatus 100 will be sequentially described.

First, as illustrated in (1) of FIG. 5, when the substrate W is loaded, the refrigerating device 30 is lifted by moving the second elevating device 78 up, and the contacts 21a and 21b are brought into contact with each other (the state of FIG. 2A). At this time, the rotation operation by the rotating device 40 is stopped, and the mounting table 20 is not rotating.

Next, as illustrated in (2) of FIG. 5, a DC voltage is applied to the chuck electrode 32, and the substrate W is cooled in a state in which the substrate W is suctioned by the electrostatic chuck. Following the (1) of FIG. 5, the contacts 21*a* and 21*b* are in a contact state (the state of FIG. 2A). At this time, the rotation operation by the rotating device 40 is stopped.

Next, as illustrated in (3) of FIG. 5, immediately before a process (for example, the film forming process) is performed, the refrigerating device 30 is moved down by moving the second elevating device 78 down, and the contacts 21*a* and 21*b* are separated from each other during the process (the state of FIG. 2B). At this time, the contact between the contacts 21*a* and 21*b* illustrated by A in FIG. 2A becomes a non-contact (separated) state illustrated by A in FIG. 2B, and the spring 26 illustrated by B in FIG. 2A extends as illustrated by B in FIG. 2B. Further, at this time, the rotation operation is performed by the rotating device 40, and the film forming process is performed on the substrate W in a state in which the mounting table 20 is rotated.

In the present embodiment, when the cooling structure (including the contact 21*a* on the cooling side) is formed in a block structure having a large volume, it is possible to enhance thermal conductivity at the time of contact. Further, for example, when the mounting table 20 (the contact 21*b* on the cooled side) is formed in a block structure having a large volume, cold storage efficiency at the time of separation can be enhanced.

Further, it is possible to reduce the wear at the time of contact and to enhance reproducibility of a contact pressure by providing the spring 26 on the contact. The spring 26 may be provided on the side of the mounting table, and pressing pressure at the time of contact can be adjusted by the plurality of springs 26.

Next, the application of the DC voltage to the chuck electrode 32 is stopped, and the substrate W is unloaded as illustrated in (4) of FIG. 5 in a state in which the substrate W is not suctioned on the mounting table 20 due to an electrostatic elimination process. At this time, the rotation operation by the rotating device 40 is not performed, and the mounting table 20 is not rotating. The refrigerating device 30 is moved up by moving the elevating device 78 up and down, and the contacts 21*a* and 21*b* are in contact with each other (the state illustrated in FIG. 2A).

Next, as illustrated in (5) of FIG. 5, when the substrate W is idling after it is unloaded (waiting for the substrate W to be loaded), the contacts 21*a* and 21*b* are kept in the contact state (the state of FIG. 2A). At this time, the rotation operation by the rotating device 40 is stopped. When the next substrate W is loaded, the process returns to (1) of FIG. 5, and the processes of (1) to (5) of FIG. 5 are performed.

[Method of Controlling Substrate Processing Apparatus]

Figure 6:
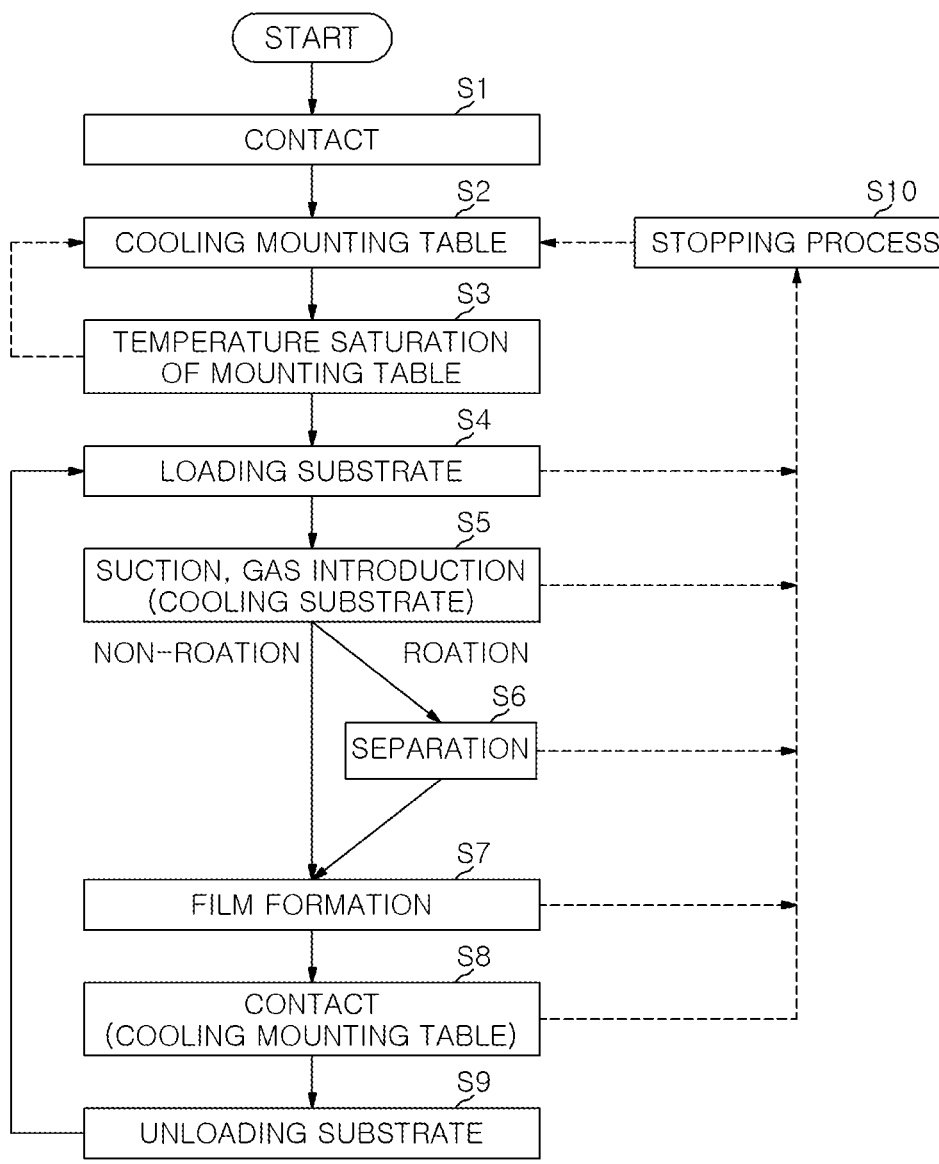
FIG. 6 is a flowchart illustrating an example of a method of controlling the substrate processing apparatus according to the embodiment.

Next, a method of controlling the substrate processing apparatus 100 according to the embodiment will be described with reference to FIG. 6. FIG. 6 is a flowchart illustrating an example of the method of controlling the substrate processing apparatus 100 according to the embodiment. The process of FIG. 6 is controlled by the controller 80. A solid line arrow indicates a processing direction when the temperature of the mounting part 25 on which the substrate W is mounted is normal, and a broken line arrow indicates a processing direction when the temperature of the mounting part 25 is abnormal.

When this processing is started, before the substrate W mounted on the mounting part 25 of the mounting table 20 is processed, the controller 80 causes the refrigerating device 30 to be moved up and down by the second elevating device 78 and controls the contacts to be brought into contact with the refrigerating device 30 or the mounting part 25 (Step 1).

Due to the control of Step S1, for example, in the example of FIG. 2A, the contact 21*a* comes into contact with the mounting part 25 via the contact 21*b*. Further, for example, in the example of FIG. 4, the contact 21*a* comes into contact with the cold link 35. As a result, the controller 80 directly cools the mounting part 25 from the refrigerating device 30 (Step S2). When the temperature of the mounting part 25 reaches a saturated state and the mounting part 25 is stabilized at a predetermined temperature (Step S3), the controller 80 loads the substrate W (Step S4). On the other hand, when the temperature of the mounting part 25 does not reach the saturation state in Step S3 and the temperature of the mounting part 25 is abnormal, the controller 80 does not load the substrate W and returns to Step S2. In Step S2, the mounting part 25 is cooled again by the refrigerating device 30, and the processes of Steps S2 and S3 are repeated until the temperature of the mounting part 25 reaches the saturated state.

After the substrate W is loaded in Step S4, the controller 80 applies a DC voltage to the chuck electrode 32 and controls the substrate W to be contact-cooled in a state in which the substrate W is suctioned by the electrostatic chuck (Step S5). Further, the controller 80 controls so that the first cooling gas (for example, He gas) is supplied from the refrigerant supply flow path 51 to a space in which the spring 26 is disposed, and the second cooling gas (for example, He gas) is supplied from the second cooling gas supply pipe 34 to a space between the lower surface of the substrate W and the upper surface of the mounting part 25.

Next, the controller 80 controls the contact 21*a* to be separated from the mounting part 25 in order to perform the film forming process (Step S6). As a result, as illustrated in FIG. 2B, the contact 21*a* is separated from the mounting part 25 via the contact 21*b*. However, when the mounting table 20 is not rotated during the film forming process, the process may proceed to Step S7 without performing the process of Step S6.

Due to Step S6, the contact 21*a* is separated from the mounting part 25, and the mounting part 25 can be rotated. The controller 80 controls the substrate W to be subjected to a desired film forming process while the mounting part 25 is rotated by the rotating device 40 (Step S7). However, when the film forming process is performed without rotating the mounting part 25, the controller 80 performs Step S6 or does not perform Step S6 and then performs the film forming process on the substrate W without rotating the substrate W. The controller 80 stops the rotation of the mounting table 20 by the rotating device 40 after the film forming process on the substrate W is performed.

Next, the controller 80 causes the refrigerating device 30 to be moved up by the second elevating device 78, controls the contact 21*a* to be brought into contact with the mounting part 25 via the contact 21*b*, and cools the mounting part 25 by the refrigerating device 30 (Step S8). Then, the controller 80 unloads the substrate W (Step S9) and finishes this processing.

In Steps S4 to S8, when it is determined that the temperature of the mounting part 25 is abnormal because it exceeds a predetermined threshold value, the controller 80 stops the process (Step S10) and returns to the process of bringing the contacts 21*a* and 21*b* of Step S2 into contact with each other and cooling the mounting part 25. In this case, the controller 80 performs the processing after Step S2 again.

Further, in the method of controlling the substrate processing apparatus 100 of FIG. 6, the refrigerating device 30 is moved up and down by the second elevating device 78, and the contacts are brought into contact with or separated from the refrigerating device 30 or the mounting table 20. However, the present disclosure is not limited thereto, and for example, the refrigerating device 30 may be moved up and down by the first elevating device 77, and the contacts may be brought into contact with or separated from the refrigerating device 30 or the mounting table 20.

It should be considered that the mounting table structure, the substrate processing apparatus, and the method of controlling the substrate processing apparatus according to the embodiments disclosed herein are exemplary in all respects and should be considered as not being restrictive. The embodiments may be modified and improved in various forms without departing from the scope of the appended claims and their gist. The matters described in the plurality of embodiments may have other configurations within a non-contradictory range and may be combined within a non-contradictory range.

What is claimed is:

1. A mounting table structure comprising:
a mounting table on which a substrate is mounted;
a refrigerating mechanism configured to cool the substrate and comprising a cooled upper surface facing the mounting table;
an elevating drive part configured to move the mounting table or the refrigerating mechanism up and down; and
a plurality of contacts provided at a position between the refrigerating mechanism and the mounting table which face each other,
wherein the plurality of contacts include a plurality of first contacts disposed on the refrigerating mechanism and a second contact disposed on the mounting table,
wherein the refrigerating mechanism and the mounting table are allowed to be brought into contact with each other via the plurality of first contacts and the second contact by moving the mounting table or the refrigerating mechanism up and down by the elevating drive part, and
wherein the plurality of first contacts are each connected to one of a plurality of elastic bodies, the plurality of first contacts being mounted on the cooled upper surface of the refrigerating mechanism via the plurality of elastic bodies.

2. The mounting table structure of claim 1, wherein the plurality of first contacts are configured to come into contact with or separate from the second contact by moving the mounting table or the refrigerating mechanism up and down by the elevating drive part.

3. The mounting table structure of claim 2, wherein a contact surface of the plurality of first contacts, which comes into contact with the refrigerating mechanism, is divided.

4. The mounting table structure of claim 2, wherein a contact surface of the plurality of first contacts, which comes into contact with the refrigerating mechanism, is a flat surface.

5. The mounting table structure of claim 1, wherein the plurality of first contacts are each connected to one of a plurality of heat transfer members and are mounted on the refrigerating mechanism via the plurality of elastic bodies and the plurality of heat transfer members.

6. The mounting table structure of claim 1, wherein the refrigerating mechanism has a flow path in which a temperature control medium is supplied, and
a distal end of the flow path opens into a space between the refrigerating mechanism and the mounting table and supplies the temperature control medium from the flow path to the space.

7. The mounting table structure of claim 6, further comprising a rotation drive part configured to rotate the substrate,
wherein the rotation drive part rotates the substrate in a state in which the plurality of first contacts are separated from the second contact.

8. The mounting table structure of claim 1, wherein at least a surface of the plurality of first contacts that comes into contact with the second contact is surface-treated by plating.

9. The mounting table structure of claim 1, wherein a contact surface of the plurality of first contacts that comes into contact with the refrigerating mechanism has a circular shape or a shape obtained by dividing the circular shape into four on an inner peripheral side and eight on an outer peripheral side.

10. A substrate processing apparatus comprising a processing container and a mounting table structure,
wherein the mounting table structure includes:
a mounting table on which a substrate is placed in the processing container;
a refrigerating mechanism configured to cool the substrate and comprising a cooled upper surface facing the mounting table;
an elevating drive part configured to move the mounting table or the refrigerating mechanism up and down; and
a plurality of contacts provided at a position between the refrigerating mechanism and the mounting table which face each other, and
the plurality of contacts include a plurality of first contacts disposed on the refrigerating mechanism and a second contact disposed on the mounting table,
the refrigerating mechanism and the mounting table are allowed to be brought into contact with each other via the plurality of first contacts and the second contact by moving the mounting table or the refrigerating mechanism up and down by the elevating drive part, and
the plurality of first contacts are each connected to one of a plurality of elastic bodies, the plurality of first contacts being mounted on the cooled upper surface of the refrigerating mechanism via the plurality of elastic bodies.

11. The substrate processing apparatus of claim 10, wherein the substrate processing apparatus includes a controller, and
the controller controls the plurality of first contacts to be brought into contact with the second contact by the elevating drive part before the substrate mounted on the mounting table is processed.

12. The substrate processing apparatus of claim 11, wherein the controller controls the plurality of first contacts to be separated from the second contact while the substrate is processed.

13. The substrate processing apparatus of claim 12, wherein the substrate processing apparatus has a rotation drive part configured to rotate the substrate, and
the controller separates the plurality of first contacts from the second contact and then controls the rotation drive part to rotate the substrate.

14. The substrate processing apparatus of claim 13, wherein, after the substrate is processed, the controller stops rotation of the mounting table by the rotation drive part and controls the elevating drive part so that the plurality of first contacts come into contact with the second contact.

15. The substrate processing apparatus of claim 10, wherein the elevating drive part moves the mounting table or the refrigerating mechanism up and down by an air cylinder or a motor.

* * * * *